(12) United States Patent
Kotake et al.

(10) Patent No.: US 11,401,381 B2
(45) Date of Patent: Aug. 2, 2022

(54) MODIFIED SILICONE COMPOUND, AND THERMOSETTING RESIN COMPOSITION, PREPREG, LAMINATE PLATE AND PRINTED WIRING BOARD USING SAME

(75) Inventors: Tomohiko Kotake, Ibaraki (JP); Masato Miyatake, Ibaraki (JP); Shunsuke Nagai, Ibaraki (JP); Shintaro Hashimoto, Ibaraki (JP); Yasuo Inoue, Ibaraki (JP); Shin Takanezawa, Ibaraki (JP); Hikari Murai, Ibaraki (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 13/980,385

(22) PCT Filed: Jan. 17, 2012

(86) PCT No.: PCT/JP2012/050877
§ 371 (c)(1),
(2), (4) Date: Aug. 28, 2013

(87) PCT Pub. No.: WO2012/099133
PCT Pub. Date: Jul. 26, 2012

(65) Prior Publication Data
US 2013/0330563 A1    Dec. 12, 2013

(30) Foreign Application Priority Data

Jan. 18, 2011   (JP) .............................. JP2011-008307

(51) Int. Cl.
| | | |
|---|---|---|
| C08L 83/08 | (2006.01) | |
| C08G 73/02 | (2006.01) | |
| C08G 73/12 | (2006.01) | |
| C08G 77/388 | (2006.01) | |
| C08L 79/08 | (2006.01) | |
| C09D 183/08 | (2006.01) | |
| C08L 63/00 | (2006.01) | |
| C09D 163/00 | (2006.01) | |

(52) U.S. Cl.
CPC ....... *C08G 73/0273* (2013.01); *C08G 73/125* (2013.01); *C08G 77/388* (2013.01); *C08L 63/00* (2013.01); *C08L 79/085* (2013.01); *C08L 83/08* (2013.01); *C09D 163/00* (2013.01); *C09D 183/08* (2013.01); *Y10T 428/31663* (2015.04)

(58) Field of Classification Search
CPC ........ C08L 63/00; C08L 79/085; C08L 83/08; C08G 73/0273; C08G 73/125; C08G 77/388; C08J 2379/08; C08J 5/24; C08K 5/544; C09D 163/00; C09D 183/08; H05K 1/0346; H05K 2201/0162; H05K 3/389

USPC .................................................. 428/410, 420
See application file for complete search history.

(56) References Cited

U.S. PATENT DOCUMENTS

| | | | | |
|---|---|---|---|---|
| 4,847,344 A | * | 7/1989 | Barthelemy et al. ......... 526/262 |
| 5,856,425 A | * | 1/1999 | Rosenfeld .............. C08G 73/12 |
| | | | | 156/330.9 |
| 2012/0077401 A1 | * | 3/2012 | Kotake et al. ................ 442/147 |
| 2013/0330563 A1 | | 12/2013 | Kotake et al. | |
| 2015/0017453 A1 | * | 1/2015 | Aoyagi ..................... B32B 7/10 |
| | | | | 428/426 |

FOREIGN PATENT DOCUMENTS

| | | |
|---|---|---|
| JP | 63-235329 | 9/1988 |
| JP | H03-100020 A | 4/1991 |
| JP | 5-148343 | 6/1993 |

(Continued)

OTHER PUBLICATIONS

Office Action dated Aug. 9, 2016, for Japanese Application No. 2015-212821.

(Continued)

*Primary Examiner* — Michael B Nelson
(74) *Attorney, Agent, or Firm* — Fitch, Even, Tabin & Flannery, L.L.P.

(57) ABSTRACT

There are provided a modified silicone compound prepared by reacting: (A) a siloxane diamine represented by the general formula (1); (B) a maleimide compound with at least two N-substituted maleimide groups in the molecular structure; and (C) an amine compound with an acidic substituent; and also provided a thermosetting resin composition, a prepreg, a laminated plate, and a printed wiring board that are formed by using this compound. The multi-layered printed wiring board produced by using the laminated plate formed by using the prepreg obtained from the modified silicone compound and the thermosetting resin composition of the present invention through laminate molding has an excellent glass transition temperature, coefficient of thermal expansion, copper foil adhesion, hygroscopicity, hygroscopic solder heat resistance, and copper-stuck solder heat resistance. Therefore, the multi-layered printed wiring board is useful as a highly integrated semiconductor package and a printed wiring board for an electronic device.

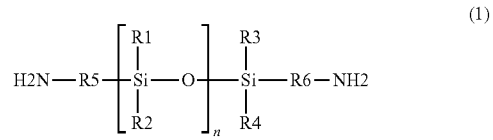

(1)

17 Claims, No Drawings

(56) References Cited

FOREIGN PATENT DOCUMENTS

| | | |
|---|---|---|
| JP | 6-263843 | 9/1994 |
| JP | 9-328565 | 12/1997 |
| JP | 10-60111 | 3/1998 |
| JP | 11-193328 | 7/1999 |
| JP | 2009-68008 | 4/2009 |
| JP | 5835233 B2 | 11/2015 |
| WO | WO 2007/119854 A1 | 10/2007 |
| WO | WO 2010/110433 * | 9/2010 |

OTHER PUBLICATIONS

Official Action dated Jul. 18, 2017, for Japanese Patent application No. 2016-233097.

* cited by examiner

MODIFIED SILICONE COMPOUND, AND THERMOSETTING RESIN COMPOSITION, PREPREG, LAMINATE PLATE AND PRINTED WIRING BOARD USING SAME

TECHNICAL FIELD

The present invention relates to a modified silicone compound suitable for a semiconductor package and a printed wiring board and also relates to a thermosetting insulating resin composition, a prepreg, a laminated plate, and a printed wiring board that are formed by using this compound.

BACKGROUND ART

Associated with a trend toward miniaturization and high performance of an electronic device in recent years, in a printed wiring board, high wiring density and high integration have been developed. This steps up to demands for reliability improvement by enhancing the heat resistance of the laminated plate for wiring. In such an application, particularly a semiconductor package, the laminated plate is required to have not only excellent heat resistance but also a low linear expansion coefficient.

The laminated plate for a printed wiring board generally is formed by curing and integrating a resin composition mainly composed of an epoxy resin and a glass woven fabric. The epoxy resin is generally excellent in a balance among insulating properties, heat resistance, a cost, and the like. However, to respond to the request for improving of the heat resistance in accordance with the high-density packaging and the highly multi-layered structure of a printed wiring board of recent years, the increase of the heat resistance is inevitably limited. The high coefficient of thermal expansion is attempted to be lowered by choosing an epoxy resin with an aromatic ring or by highly filling an inorganic filler such as silica (see Patent Documents 1 and 2).

However, the increased amount of the inorganic filler in a resin composition for a laminated plate causes the lowered insulation reliability due to moisture absorption, the insufficient adhesion between the resin composition layer and the wiring layer, and the failure of press molding.

A poly-bis-maleimide resin widely used for a laminated plate with high-density packaging and highly multi-layered structure has extremely excellent heat resistance but has a high hygroscopicity and a drawback for the adhesion. Furthermore, the poly-bis-maleimide resin requires a higher temperature and a longer time in the lamination than an epoxy resin and therefore suffers from the low productivity.

Specifically, an epoxy resin can generally be cured at a temperature of 180° C. or less, while a poly-bis-maleimide resin is laminated at a high temperature of 220° C. or more for a long time. A modified imide resin composition has the improved moisture resistance and adhesion (for example, see Patent document 2). However, the modified imide resin composition is modified with a low-molecular compound containing a hydroxyl and an epoxy groups to ensure the solubility in an all-purpose solvent such as methyl ethyl ketone. Therefore, the heat resistance of the obtained modified imide resin is considerably inferior to that of a poly-bis-maleimide resin.

Prior Art Documents

Patent Documents

[Patent Document 1] JP-A-5-148343
[Patent Document 2] JP-A-6-263843

SUMMARY OF THE INVENTION

Problems to be Solved by the Invention

In view of the current situation, the objective of the present invention is to provide a thermosetting resin composition, particularly with excellent low water absorbability and low thermal expansion properties and also to provide a prepreg, a laminated plate, and a printed wiring board that are formed by using this composition.

Means for Solving the Problems

As a result of their extensive studies, the inventors found that the above-mentioned objective can be accomplished by using a modified silicone compound having a specific structure, and they have achieved the present invention.

The present invention provides a modified silicone compound, a thermosetting resin composition, a prepreg, a laminated plate, and a printed wiring board as described below.

1. A modified silicone compound prepared by reacting: (A) a siloxane diamine represented by the following general formula (1); (B) a maleimide compound with at least two N-substituted maleimide groups in the molecular structure; and (C) an amine compound with an acidic substituent represented by the following general formula (2).

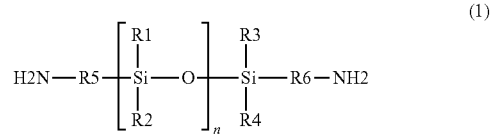

In the formula (1), a plurality of $R_1$s each independently represent an alkyl group, a phenyl group, or a substituted phenyl group and may be the same as or the different from each other, a plurality of $R_2$s each independently represent an alkyl group, a phenyl group, or a substituted phenyl group and may be the same as or the different from each other, $R_3$ and $R_4$ each independently represent an alkyl group, a phenyl group, or a substituted phenyl group, $R_5$ and $R_6$ each independently represent a divalent organic group, and n represents an integer of 2-50.

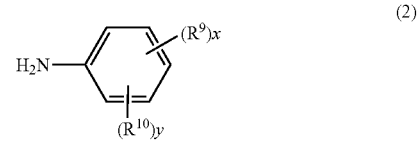

In the formula (2), $R_9$ or a plurality of $R_9$s each independently represent a hydroxyl, a carboxyl, or a sulfonic group that is an acidic substituent, $R_{10}$ or a plurality of $R_{10}$s each independently represent a hydrogen atom, an aliphatic hydrocarbon group with 1-5 carbon atoms, and a halogen atom, x represents an integer of 1-5, y represents an integer of 0-4, and x+y=5.

2. A modified silicone compound prepared by reacting: (D) an amine compound with at least two primary amino groups per molecule with the compounds (A), (B), and (C) according to the above-mentioned 1.

3. A thermosetting resin composition comprising the modified silicone compound according to the above-mentioned 1 or 2.
4. The thermosetting resin composition according to the above-mentioned 3, further comprising an epoxy resin and/or a cyanate resin as a thermosetting resin.
5. The thermosetting resin composition according to the above-mentioned 3 or 4, further comprising an inorganic filler.
6. A prepreg formed by using the thermosetting resin composition according to any one of the above-mentioned 3-5.
7. A laminated plate formed by using the prepreg according to the above-mentioned 6 through laminate molding.
8. A multi-layered printed wiring board produced by using the laminated plate according to the above-mentioned 7.

Effects of the Invention

The prepreg obtained by impregnating or coating a base material with the thermosetting resin composition containing a modified silicone compound of the present invention and the laminated plate produced by using this prepreg through laminate molding have particularly excellent low water absorbability and low thermal expansion properties. This laminated plate is useful for a printed wiring board for an electronic device.

MODES FOR CARRYING OUT THE INVENTION

The present invention will be explained in detail below. The modified silicone compound of the present invention is prepared by reacting: (A) a siloxane diamine represented by the following general formula (1); (B) a maleimide compound with at least two N-substituted maleimide groups in the molecular structure; and (C) an amine compound with an acidic substituent represented by the following general formula (2).

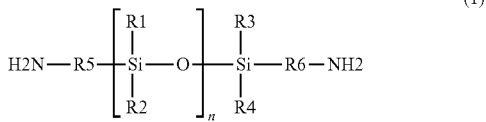

(1)

In the formula (1), a plurality of $R_1$s each independently represent an alkyl group, a phenyl group, or a substituted phenyl group and may be the same as or the different from each other, a plurality of $R_2$s each independently represent an alkyl group, a phenyl group, or a substituted phenyl group and may be the same as or the different from each other, $R_3$ and $R_4$ each independently represent an alkyl group, a phenyl group, or a substituted phenyl group, $R_5$ and $R_6$ each independently represent a divalent organic group, and n represents an integer of 2-50.

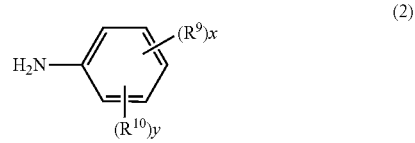

(2)

In the formula (2), $R_9$ or a plurality of $R_9$s each independently represent a hydroxyl, a carboxyl, or a sulfonic group that is an acidic substituent, $R_{10}$ or a plurality of $R_{10}$s each independently represent a hydrogen atom, an aliphatic hydrocarbon group with 1-5 carbon atoms, and a halogen atom, x represents an integer of 1-5, y represents an integer of 0-4, and x+y=5

As the siloxane diamine (A) represented by the general formula (1) in the thermosetting resin composition of the present invention, a commercially available material can be used including, for example, "KF-8010" (amine equivalent: 430), "X-22-161A" (amine equivalent: 800), "X-22-161B" (amine equivalent: 1500), "KF-8012" (amine equivalent: 2200), "KF-8008" (amine equivalent: 5700), "X-22-9409" (amine equivalent: 700), and "X-22-1660B-3" (amine equivalent: 2200) (available from Shin-Etsu Chemical Co., Ltd.); and "BY-16-853U" (amine equivalent: 460), "BY-16-853" (amine equivalent: 650), and "BY-16-853B" (amine equivalent: 2200) (available from Dow Corning Toray Co., Ltd.). These may be used alone or in combination with two or more kinds.

Among these siloxane diamines, X-22-161A, X-22-161B, KF-8012, KF-8008, X-22-1660B-3, and BY-16-853B are preferable from the viewpoint of the low water absorbability, and X-22-161A, X-22-161B, and KF-8012 are particularly preferable from the viewpoint of the low thermal expansion properties.

The maleimide compound with at least two N-substituted maleimide groups in the molecular structure (B) includes, for example, N,N'-ethylenebismaleimide, N,N'-hexamethylenebismaleimide, N,N'-(1,3-phenylene)bismaleimide, N,N'-[1,3-(2-methylphenylene)]bismaleimide, N,N'-[1,3-(4-methylphenylene)]bismaleimide, N,N'-(1,4-phenylene)bismaleimide, bis(4-maleimide phenyl)methane, bis(3-methyl-4-maleimide phenyl)methane, 3,3-dimethyl-5,5-diethyl-4,4-diphenylmethane bismaleimide, bis(4-maleimide phenyl)ether, bis(4-maleimide phenyl)sulfone, bis(4-maleimide phenyl)sulfide, bis(4-maleimide phenyl)ketone, bis(4-maleimide cyclohexyl)methane, 1,4-bis(4-maleimide phenyl)cyclohexane, 1,4-bis(maleimide methyl)cyclohexane, 1,4-bis(maleimide methyl)benzene, 1,3-bis(4-maleimidephenoxy)benzene, 1,3-bis(3-maleimidephenoxy)benzene, bis[4-(3-maleimidephenoxy)phenyl]methane, bis[4-(4-maleimidephenoxy)phenyl]methane, 1,1-bis[4-(3-maleimidephenoxy)phenyl]ethane, 1,1-bis[4-(4-maleimidephenoxy)phenyl]ethane, 1,2-bis[4-(3-maleimidephenoxy)phenyl]ethane, 1,2-bis[4-(4-maleimidephenoxy)phenyl]ethane, 2,2-bis[4-(3-maleimidephenoxy)phenyl]propane, 2,2-bis[4-(4-maleimidephenoxy)phenyl]propane, 2,2-bis[4-(3-maleimidephenoxy)phenyl]butane, 2,2-bis[4-(4-maleimidephenoxy)phenyl]butane, 2,2-bis[4-(3-maleimidephenoxy)phenyl]-1,1,1,3,3,3-hexafluoropropane, 2,2-bis[4-(4-maleimidephenoxy)phenyl]-1,1,1,3,3,3-hexafluoropropane, 4,4-bis(3-maleimidephenoxy)biphenyl, 4,4-bis(4-maleimidephenoxy)biphenyl, bis[4-(3-maleimidephenoxy)phenyl]ketone, bis[4-(4-maleimidephenoxy)phenyl]ketone, 2,2'-bis(4-maleimide phenyl)disulfide, bis(4-maleimide phenyl)disulfide, bis[4-(3-maleimidephenoxy)phenyl]sulfide, bis[4-(4-maleimidephenoxy)phenyl]sulfide, bis[4-(3-maleimidephenoxy)phenyl]sulfoxide, bis[4-(4-maleimidephenoxy)phenyl]sulfoxide, bis[4-(3-maleimidephenoxy)phenyl]sulfone, bis[4-(4-maleimidephenoxy)phenyl]sulfone, bis[4-(3-maleimidephenoxy)phenyl]ether, bis[4-(4-maleimidephenoxy)phenyl]ether, 1,4-bis[4-(4-maleimidephenoxy)-α,α-dimethylbenzyl]benzene, 1,3-bis[4-(4-maleimidephenoxy)-α,α-dimethylbenzyl]benzene, 1,4-bis[4-(3-maleimidephenoxy)-α,α-dimethylbenzyl]benzene, 1,3-bis[4-(3-maleimidephenoxy)-α,α-dimethylbenzyl]benzene, 1,4-bis[4-(4-maleimidephenoxy)-3,5-dimethyl-α,α-dimethylbenzyl]benzene, 1,3-bis[4-(4-maleimidephenoxy)-3,5-dimethyl-α,α-dimethylbenzyl]benzene, 1,4-bis[4-(3-maleimidephenoxy)-3,5-dimethyl-α,α-dimethylbenzyl]benzene, 1,3-bis[4-(3-maleimidephenoxy)-3,5-dimethyl-α,α-dimethylbenzyl]benzene, and polyphenylmethane maleimide (for example, trade name: BMI-2300, available from Daiwa Fine Chemicals Co., Ltd.). These maleimide compounds may be used alone or in combination with two kinds or more.

In these maleimide compounds, bis(4-maleimide phenyl) methane, bis(4-maleimide phenyl)sulfone, N,N'-(1,3-phenylene)bismaleimide, 2,2-bis(4-(4-maleimidephenoxy)phenyl)propane, and polyphenylmethane maleimide can preferably provide high reaction rate and higher thermostability. Particularly, from the viewpoint of the solubility in a solvent, bis(4-maleimide phenyl)methane is particularly preferable.

The amine compound with an acidic substituent of the component (C) includes, for example, m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline, and 3,5-dicarboxy aniline. Among these, from the viewpoint of the solubility and the synthetic yield, m-aminophenol, p-aminophenol, o-aminophenol, p-aminobenzoic acid, m-aminobenzoic acid, and 3,5-dihydroxyaniline are preferable. From the viewpoint point of the heat resistance, m-aminophenol and p-aminophenol are more preferable.

When the above-mentioned components (A), (B), and (C) are reacted in an organic solvent, the reaction temperature is preferably 70-150° C., more preferably 100-130° C. Furthermore, the reaction time is preferably 0.1-10 hours, more preferably 1-6 hours.

For the amount used of the siloxane diamine (A) and the monoamine compound with an acidic substituent (C), the following expression relating the total —NH$_2$ group equivalent to the C=C group equivalent of the maleimide compound (B) is preferably true. 0.1≤C=C group equivalent/total —NH$_2$ group equivalent≤10.0 More preferably, the following expression is true. 1.0≤C=C group equivalent/total —NH$_2$ group equivalent≤9.0 Particularly preferably, the following expression is true. 2.0≤C=C group equivalent/total —NH$_2$ group equivalent≤8.0

The equivalent ratio of 0.1 or more never lowers the gelation and the heat resistance, and 10.0 or less never lowers the solubility in an organic solvent and the heat resistance.

While the relationship as described above is maintained, the amount used of the component (B) is preferably 50-3000 parts by mass, more preferably 100-1500 parts by mass based on 100 parts by mass of the component (A). The component (B) used in an amount of 50 parts by mass or more never lowers the heat resistance, and 3000 parts by mass or less can suitably maintain the low thermal expansion properties.

The amount used of the component (C) is preferably 1-1000 parts by mass, more preferably 10-500 parts by mass based 100 parts by mass of the component (A). The component (C) used in an amount of 1 part by mass or more never lowers the heat resistance, and 1000 parts by mass or less can suitably maintain the low thermal expansion properties.

The organic solvent used in this reaction is not limited in particular but includes, for example, alcohol solvents such as ethanol, propanol, butanol, methyl cellosolve, butyl cellosolve, and propylene glycol methyl ether; ketone solvents such as acetone, methyl ethyl ketone, methyl isobutyl ketone, and cyclohexanone; ester solvents such as ethyl acetate ester and γ-butyrolactone; an ether solvent such as tetrahydrofurane; aromatic solvents such as toluene, xylene, and mesitylene; nitrogen atom-containing solvents such as dimethylformamide, dimethylacetamide, and N-methylpyrrolidone; a sulfur atom-containing solvent such as a dimethylsulfoxide. These can be used alone or in combination of two or more kinds.

Among these, from the viewpoint of the solubility, cyclohexanone, propylene glycol monomethyl ether, methyl cellosolve, and γ-butyrolactone are preferable. From the viewpoint of the low toxicity and of hardly remaining as a residual solvent due to high volatility, cyclohexanone, propylene glycol monomethyl ether, and dimethylacetamide are particularly preferable.

The amount used of the organic solvent is preferably 25-1000 parts by mass, more preferably 50-500 parts by mass based on 100 parts by mass of the total amount of the components (A), (B), and (C). The organic solvent used in an amount of 25-1000 parts by mass is preferable with no disadvantages such as the lack of solubility and a long time required for the synthesis.

For this reaction, any catalysts can be used with no limitation in particular. The example of the catalyst includes amines such as of triethylamine, pyridine, and tributylamine; imidazoles such as methylimidazole and phenylimidazole; and a phosphorous catalyst such as triphenylphosphine. These can be used alone or in combination of two or more kinds.

The modified silicone compound of the present invention can be prepared by reacting: (D) an amine compound with at least two primary amino groups per molecule with the compounds (A), (B), and (C).

The amine compound (D) is not limited in particular but includes, for example, aromatic amines such as m-phenylenediamine, p-phenylenediamine, 4,6-dimethyl-m-phenylenediamine, 2,5-dimethyl-p-phenylenediamine, 2,3,5,6-tetramethyl-p-phenylenediamine, 2,4-diaminomesitylene, m-xylene-2,5-diamine, m-xylylenediamine, p-xylylenediamine, 2,4-diaminotoluene, 2,5-diaminotoluene, 2,4-bis(amino-t-butyl)toluene, 2,4-diaminoxylene, 2,4-diaminopyridine, 2,6-diaminopyridine, 2,5-diaminopyridine, 2,4-diaminodurene, 4,5-diamino-6-hydroxy-2-mercaptopyrimidine, 3-bis(3-aminobenzyl)benzene, 4-bis(4-aminobenzyl)benzene, 1,4-bis(4-aminophenyl)benzene, 1,3-bis(3-aminophenoxy)benzene, 1,3-bis(4-aminophenoxy)benzene, 1,4-bis(4-aminophenoxy)benzene, 3-bis(3-(3-aminophenoxy)phenoxy)benzene, 4-bis(4-(4-aminophenoxy)phenoxy)benzene, 3-bis(3-(3-aminophenoxy)phenoxy)benzene, 4-bis(4-(4-(4-aminophenoxy)phenoxy)phenoxy)benzene, 3-bis(α,α-dimethyl-3-aminobenzyl)benzene, 1,4-bis(α,α-dimethyl-3-aminobenzyl)benzene, 3-bis(α,α-dimethyl-4-aminobenzyl)benzene, bis(4-methylaminopentyl)benzene, p-bis(2-methyl-4-aminopentyl)benzene, 1,4-bis(3-aminopropyldimethylsilyl)benzene, bis[(4-aminophenyl)-2-propyl]1,4-benzene, 2,5-diaminobenzenesulfonic acid, 3,3'-diaminodiphenylmethane, 4,4'-diaminodiphenylmethane, 3,3'-dimethyl-4,4'-diaminodiphenylmethane, 3,3',5,5'-tetramethyl-4,4'-diaminodiphenylmethane, 3,3'-diethyl-4,4'-diaminodiphenylmethane, 3,3'-dimethyl, 5,5'-diethyl-4,4'-diaminodiphenylmethane, 4,4'-methylene-bis(2-chloroaniline), 3,3'-diamino diphenyl ethane, 4,4'-diamino diphenyl ethane, 2,2'-diamino diphenyl propane, 3,3'-diamino diphenyl propane, 4,4'-diamino diphenyl propane, 2,2'-bis[4-(4-aminophenoxy)phenyl]propane, 2,2'-bis[4-(4-aminophenoxy)phenyl]hexafluoropropane, 3-(2',4'-diaminophenoxy)propane sulfonic acid, bis(4-aminophenyl)diethylsilane, 3,3'-diaminobenzophenone, 4,4'-diaminobenzophenone, 3,3'-diaminodiphenyl ether, 4,4'-diaminodiphenyl ether, 3,3'-dimethyl-4,4'-diaminodiphenyl ether, bis(4-amino-t-butylphenyl)ether, 4,4'-diaminodiphenyl ether-2,2'-disulfonic acid, 3,3'-diaminodiphenyl sulfone, 4,4'-diaminodiphenyl sulfone, bis[4-(4-aminophenoxy)phenyl]sulfone, bis[4-(3-aminophenoxy)phenyl]sulfone, benzidine, 2,2'-dimethyl-4,4'-diaminobiphenyl, 3,3'-dimethyl-4,4'-diaminobiphenyl, 3,3'-dimethoxy-4,4'-diaminobiphenyl, 3,3'-dimethyl-4,4'-diaminobiphenyl-6,6'-disulfonic acid, 2,2',5,5'-tetrachloro-4,4'-diaminobiphenyl, 3,3'-dichloro-4,4'-diaminobiphenyl, 4,4'-bis(4-aminophenoxy)biphenyl, 4,4'-diaminodiphenyl sulfide, 4,4'-diamino-3,3'-biphenyldiol, 1,5-diaminonaphthalene, 1,4-diaminonaphthalene, 2,6-diaminonaphthalene, 9,9'-bis(4-aminophenyl)fluorene, 9,9'-bis(4-aminophenyl)fluoren-2,7-disulfonic acid, 9,9'-bis(4-aminophenoxyphenyl)fluorene, diaminoanthraquinone, 3,7-diamino-2,8-dimethyldibenzothiophene sulfone; aliphatic amines such as ethylenediamine, tetramethylenediamine, pentamethylenediamine, hexamethylenediamine, heptamethylenediamine, octamethylenediamine, nonamethylenediamine, decamethylenediamine, 2,5-dimethylhexamethylenediamine, 3-methoxyhexamethylenediamine, 2,5-dimethylheptamethylenediamine, 3-methylheptamethylenediamine, 4,4-dimethylheptamethylenediamine, 5-methylnonamethylenediamine, 1,4-diaminocyclohexane, 1,3-bis(3-aminopropyl)tetramethyldisiloxane, 2,5-diamino-1,3,4-oxadiazole, bis(4-aminocyclohexyl)methane; and guanamine compounds such as melamine, benzoguanamine, acetoguanamine, 2,4-diamino-6-vinyl-s-triazine, 2,4-diamino-6-allyl-s-triazine, 2,4-diamino-6-acryloyloxyethyl-s-triazine, and 2,4-diamino-6-methacryloyloxyethyl-s-triazine.

Among these, with the excellent reactivity and the heat resistance, aromatic amines such as m-phenylenediamine, p-phenylenediamine, 1,4-bis(4-aminophenoxy)benzene, 4,4'-diaminodiphenylmethane, 3,3'-dimethyl-4,4'-diaminodiphenylmethane, 3,3'-diethyl-4,4'-diaminodiphenylmethane, 2,2'-bis[4-(4-aminophenoxy)phenyl]propane, 4,4'-diaminobenzophenone, 4,4'-diaminodiphenyl ether, 3,3'-diaminodiphenyl sulfone, 4,4'-diaminodiphenyl sulfone, bis[4-(4-aminophenoxy)phenyl]sulfone, benzidine, 4,4'-bis(4-aminophenoxy)biphenyl, 4,4'-diaminodiphenyl sulfide, and 4,4'-diamino-3,3'-biphenyldiol; and a guanamine compound such as benzoguanamine are preferable. From the viewpoint of the low price, p-phenylenediamine, 4,4'-diaminodiphenylmethane, 4,4'-diaminodiphenyl ether, 3,3'-diaminodiphenyl sulfone, 4,4'-diaminodiphenyl sulfone, 3,3'-dimethyl-4,4'-diaminodiphenylmethane, 3,3'-diethyl-4,4'-diaminodiphenylmethane, and benzoguanamine are more preferable. From the viewpoint of the toxicity and the solubility in a solvent, 3,3'-diaminodiphenyl sulfone, and 3,3'-diethyl-4,4'-diaminodiphenylmethane are particularly preferable. These can be used alone or in combination of two or more.

When the above-mentioned components (A), (B), (C), and (D) are reacted in an organic solvent, the reaction temperature is preferably 70-150° C., more preferably 100-130° C. Furthermore, the reaction time is preferably 0.1-10 hours, more preferably 1-6 hours.

For the amount used of the siloxane diamine (A), the monoamine compound with an acidic substituent (C), and the amine compound with at least two primary amino groups per molecule (D), the following expression relating the total —$NH_2$ group equivalent to the C=C group equivalent of the maleimide compound (B) is preferably true.

$0.1 \leq$ C=C group equivalent/total —$NH_2$ group equivalent $\leq 10.0$ More preferably, the following expression is true. $1.0 \leq$ C=C group equivalent/total —$NH_2$ group equivalent $\leq 9.0$ Particularly preferably, the following expression is true, $2.0 \leq$ C=C group equivalent/total —$NH_2$ group equivalent $\leq 8.0$ The equivalent ratio of 0.1 or more preferably never lowers the gelation and the heat resistance, and 10.0 or less never lowers the solubility in an organic solvent and the heat resistance.

While the relationship as described above is maintained, the amount used of the component (D) is preferably 50-3000 parts by mass, more preferably 100-1500 parts by mass based on 100 parts by mass of the component (A). The component (D) used in an amount of 50 parts by mass or more never lowers the heat resistance, and 3000 parts by mass or less can suitably maintain the low thermal expansion.

In the reaction of the components (A), (B), (C), and (D), the same organic solvent and the same catalyst as those used in the reaction of the components (A), (B), and (C) are used.

The amount used of the organic solvent is preferably 25-1000 parts by mass, more preferably 50-500 parts by mass based on 100 parts by mass of the total amount of the components (A), (B), (C), and (D). The organic solvent used in an amount of 25-1000 parts by mass is preferable with no disadvantages such as the lack of solubility and a long time required for the synthesis.

The modified silicone compound of the present invention is a thermosetting resin composition and has excellent heat curing reactivity alone. However, when the modified silicone compound is optionally used together with other thermosetting resins, the heat resistance, the adhesion, and the mechanical strength can be improved.

The thermosetting resin used together is not limited in particular but includes, for example, an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. These may be used alone or in combination with two or more kinds. Among these, from the viewpoint of the moldability and the electrical insulating properties, an epoxy resin and a cyanate resin are preferable.

The epoxy resin includes, for example, a bisphenol A epoxy resin, a bisphenol F epoxy resin, a bisphenol S epoxy resin, a phenol novolac epoxy resin, a cresol novolac epoxy resin, a bisphenol A novolac epoxy resin, a bisphenol F novolac epoxy resin, a stilbene epoxy resin, a triazine skeleton-containing epoxy resin, a fluorene skeleton-containing epoxy resin, a triphenol phenol methane epoxy resin, a biphenyl epoxy resin, a xylylene epoxy resin, a biphenyl aralkyl epoxy resin, a naphthalene epoxy resin, a dicyclopentadiene epoxy resin, an alicyclic epoxy resin, a diglycidyl ether compound of a polyfunctional phenol or a polycyclic aromatic compound such as anthracene, and a phosphorus-containing epoxy resin obtained by introducing a phosphorus compound to these resins. These may be used alone or in combination with two or more kinds. Among these, from the viewpoint of the heat resistance and the incombustibility, a biphenyl aralkyl epoxy resin and a naphthalene epoxy resin are preferable.

The cyanate resin includes, for example, a novolac cyanate resin, bisphenol cyanate resins such as a bisphenol A cyanate resin, a bisphenol E cyanate resin, and a tetramethyl bisphenol F cyanate resin, and a prepolymer obtained by converting a part of such a resin into triazine. These may be used alone or in combination with two or more kinds. Among these, from the viewpoint of the heat resistance and the incombustibility, a novolac cyanate resin is preferable.

For these thermosetting resins, a curing agent and a curing accelerator can optionally be used. The curing agent includes, for example, polyfunctional phenol compounds such as a phenol novolac, a cresol novolac, and an aminotriazine novolac resins; an amine compounds such as dicyandiamide, diaminodiphenylmethane, and diaminodiphenylsulfone; and acid anhydrides such as a phthalic anhydride, a pyromellitic anhydride, a maleic anhydride, and a maleic anhydride copolymer. These can be used alone or in combination with two or more kinds.

The curing accelerator includes, for example, an organic metal salt such as zinc naphthenate, cobalt naphthenate, tin octylate, cobalt octylate, cobalt(II) bisacetylacetonate, and cobalt(III) triacetylacetonate; an imidazole and a derivative thereof; an organic phosphorus based compound, a secondary amine, a tertiary amine, a quaternary ammonium salt. These can be used alone or in combination with two or more kinds.

In the thermosetting resin composition of the present invention, the amount used of the modified silicone compound is preferably 20-100 parts by mass, more preferably 50-90 parts by mass based on 100 parts by mass of the total amount of the resin components. The modified silicone compound used in an amount of 20 parts by mass or more provides excellent heat resistance, low water absorbability, and low thermal expansion properties.

The thermosetting resin composition of the present invention can be optionally used together with an inorganic filler. The inorganic filler includes silica, alumina, talc, mica, kaolin, aluminum hydroxide, boehmite, magnesium hydroxide, zinc borate, zinc stannate, zinc oxide, titanium oxide, boron nitride, calcium carbonate, barium sulfate, aluminum borate, potassium titanate, and glass powder and hollow glass beads of E-glass, T-glass, and D-glass. These can be used alone or in combination with two or more kinds.

Among these, from the viewpoint of the dielectric characteristics, the heat resistance, and the low thermal expansion properties, silica is particularly preferable. The silica includes, for example, precipitated silica with a high water content, which is prepared by a wet process; and dry process silica with substantially no bonding water, which is prepared by a dry process. Furthermore, the dry process silica includes crushed silica, fumed silica, and fused spherical silica that are generated based on the difference in the producing methods. Among these, fused spherical silica is preferable from the viewpoint of the low thermal expansion properties and the high fluidity when filled in the resin.

When used as the inorganic filler, the fused spherical silica preferably has an average particle size of preferably 0.1-10 μm, more preferably 0.3-8 μm. Adjusting the average particle size to 0.1 μm or more can suitably maintain the fluidity when the silica is filled in the resin. Adjusting the average particle size to 10 μm or less can decrease the probability of incorporating coarse particles so that failure caused by coarse particles can be controlled. The average particle size is herein referred to as a particle size indicated by the point corresponding to exactly 50% of the volume of particles determined from a cumulative distribution curve of particle size, in which the total volume of particles is defined as 100%. The average particle size can be measured by a particle size distribution analyzer adopting a laser diffraction scattering method or the like.

The content of the inorganic filler is preferably 20-300 parts by mass, and more preferably 50-200 parts by mass based on 100 parts by mass of the total amount of the components (A)-(D) as reduced into a solid. Adjusting the content of the inorganic filler to 20-300 parts by mass based on 100 parts by mass of the total amount of the resin components can suitably maintain the moldability and the low thermal expansion properties of the resin composition.

In the present invention, a well-known thermoplastic resin, elastomer, organic filler, flame retarder, ultraviolet light absorber, antioxidant, photopolymerization initiator, fluorescent brightener, adhesion improver, and the like can optionally be used to the extent consistent with the objective.

The thermoplastic resin includes tetrafluoroethylene, polyethylene, polypropylene, polystyrene, a polyphenylene ether resin, a phenoxy resin, a polycarbonate resin, a polyester resin, a polyamide resin, a polyimide resin, a xylene resin, a petroleum resin, and a silicone resin.

The elastomer includes polybutadiene, acrylonitrile, epoxy-modified polybutadiene, maleic anhydride-modified polybutadiene, phenol-modified polybutadiene, and carboxy-modified acrylonitrile.

The organic filler includes a uniformly structured resin filler consisting of polyethylene, polypropylene, polystyrene, a polyphenylene ether resin, a silicone resin, or a tetrafluoroethylene resin; and a core-shell structured resin filler with an elastomeric core layer consisting of an acrylic acid ester resin, a methacrylic acid ester resin, or a conjugated diene resin, and a glassy shell layer consisting of an acrylic acid ester resin, a methacrylic acid ester resin, an aromatic vinyl resin, and a vinyl cyanide resin.

The flame retarder includes a halogen-containing flame retarder containing bromine or chlorine; phosphorus flame retarders such as triphenyl phosphate, tricresyl phosphate, tris dichloropropyl phosphate, a phosphate ester compound, and red phosphorus; nitrogen flame retarders such as guanidine sulfamate, melamine sulfate, melamine polyphosphate, and melamine cyanurate; phosphazene flame retarders such as cyclophosphazene and polyphosphazene; and an inorganic flame retarder such as antimony trioxide.

The example of the ultraviolet light absorber includes a benzotriazole ultraviolet light absorber. The example of the antioxidant includes a hindered phenol antioxidant and a hindered amine antioxidant. The example of the photopolymerization initiator includes a benzophenone initiator, a benzil ketal initiator, and a thioxanthone photopolymerization initiator. The example of the fluorescent brightener includes a stilbene derivative fluorescent brightener. The example of the adhesion improver includes a coupling agent based on a urea compound such as urea silane, a silane coupling agent, a titanate coupling agent, and an aluminate coupling agent.

The modified silicone compound and the thermosetting resin composition (each sometimes referred to as "resin composition") of the present invention is used for a prepreg. Therefore, the resin composition preferably presents in varnish, in which each of the components are dissolved or dispersed in an organic solvent.

This organic solvent includes alcohol solvents such as methanol, ethanol, propanol, butanol, methyl cellosolve, butyl cellosolve, and propylene glycol monomethyl ether; ketone solvents such as acetone, methyl ethyl ketone, methyl isobutyl ketone, and cyclohexanone; ester solvents such as butyl acetate and propylene glycol monomethyl ether acetate; an ether solvent such as tetrahydrofuran; aromatic solvents such as toluene, xylene, and mesitylene; nitrogen atom-containing solvents such as dimethylformamide, dimethylacetamide, and N-methylpyrrolidone; and a sulfur atom-containing solvent such as dimethyl sulfoxide. These can be used alone or in combination with two or more kinds. Among these, from the viewpoint of the solubility, methyl ethyl ketone, methyl isobutyl ketone, cyclohexanone, methyl cellosolve, and propylene glycol monomethyl ether are preferable. From the viewpoint of the low toxicity, methyl isobutyl ketone, cyclohexanone, and propylene glycol monomethyl ether are more preferable.

When mixed with the resin composition, the inorganic filler is preferably pretreated or subjected to integral blend with a silane coupling agent, a titanate coupling agent, or a surface preparation agent such as a silicone oligomer.

The content of the finally obtained resin composition in varnish is preferably 40-90 mass %, more preferably 50-80 mass % based on the whole varnish. The resin composition contained in a content of 40-90 mass % in a varnish can suitably maintain the coating properties and provide a prepreg to which an appropriate amount of the resin composition is attached.

The prepreg of the present invention is formed by coating or impregnating a base material with the above-mentioned resin composition of the present invention or through spraying or extruding the resin composition onto or into a base material. The prepreg of the present invention will be explained in detail below.

The prepreg of the present invention can be produced by coating or impregnating a base material with the thermosetting resin composition of the present invention, followed by semi-curing (B-staging) by heating or the like. As the base material of the present invention, well-known base materials used for various multi-layered boards for electrical insulating material can be used. The material includes inorganic fibers such as E-glass, D-glass, S-glass, and Q-glass; organic fibers such as polyimide, polyester, and polytetrafluoroethylene, and a mixture thereof.

These base materials have the shapes of, for example, woven fabric, nonwoven fabric, roving, a chopped strand mat, and a surfacing mat. The material and the shape are selected in accordance with the application and the performance of a target molded product and can be used alone or in combination with the two or more kinds if necessary. The thickness of the base material is not limited in particular. For example, the base material with a thickness of about 0.03-0.5 mm can be used. The base material formed by a surface treatment with a silane coupling agent or the like or formed by a mechanical opening treatment is suitable from the viewpoint of the heat resistance, the moisture resistance, and the processability.

The prepreg of the present invention can be obtained by impregnating or coating the base material with the varnish so that the amount of the resin composition attached to the base material is 20-90 mass % in terms of a resin content of the prepreg after dried and then by typically drying by heating at a temperature of 100-200° C. for 1-30 minutes for semi-curing (B-staging).

The laminated plate of the present invention can be formed by using the above-mentioned prepreg of the present invention through laminate molding. The laminated plate can be, for example, produced by laminate molding in the structure in which 1-20 sheets of the prepreg of the present invention are deposited, and a metal foil such as copper or aluminum is disposed on either or both surfaces of the sheets. The metal foil is not limited in particular as long as used in electrical insulating materials.

To the molding condition for producing the laminated plate, for example, techniques for a laminated plate and a multi-layered board for electrical insulating material can be applied. More specifically, the molding can be performed at a temperature of 100-250° C. under a pressure of 0.2-10 MPa for a heating time of 0.1-5 hours by using a multi-stage press, a multi-stage vacuum press, a continuous molding machine, or an autoclave molding machine. Alternatively, the prepreg of the present invention can be combined with a printed wiring board for the inner layer and subjected to laminate molding to produce the laminated plate.

The printed wiring board according to the present invention is produced by forming a circuit on the surface of the laminated plate. Specifically, the conductor layer of the laminated plate according to the present invention is subjected to a wiring process by a typical etching method, and a plurality of the wiring-processed laminated plates are deposited with the above-mentioned prepreg being sandwiched. These deposited laminated plates are collectively multi-layered by a heat press process. Subsequently, a through-hole or a blind via hole is formed by drill or laser processing, and an interlayer wiring is formed by plating or electrically conductive pasting. Finally, a multi-layered printed wiring board can be produced.

EXAMPLES

The present invention will be explained in more detail with reference to the following examples. However, it should be construed that these examples do not limit the present invention at all in any meanings.

The copper clad laminated plate obtained in each of the examples and the comparative examples was used to measure and evaluate the glass transition temperature, the coefficient of thermal expansion, the copper foil adhesion, the hygroscopicity, the hygroscopic solder heat resistance, and the warp characteristics by the following methods.

(1) Measurement of Glass Transition Temperature (Tg)

The copper clad laminated plate was immersed in a copper etching liquid to remove the copper foil to fabricate a 5 mm square sample substrate. The sample substrate was subjected to thermomechanical analysis by a compression method using a TMA (thermomechanical analyzer) (TMA2940, available from Du Pont). The sample substrate was set in the analyzer in the Z direction and then continuously measured twice at a temperature elevation rate of 10° C./min with a load of 5 g. Tg indicated at the intersection point of different tangents of the thermal expansion curve in the second measurement was determined to evaluate the heat resistance.

(2) Measurement of Coefficient of Thermal Expansion

The copper clad laminated plate was immersed in a copper etching liquid to remove the copper foil to fabricate a 5 mm square sample substrate. The sample substrate was subjected to thermomechanical analysis by a compression method using a TMA (thermomechanical analyzer) (TMA2940, available from Du Pont). The sample substrate was set in the analyzer in the Z direction and continuously measured twice at a temperature elevation rate of 10° C./min with a load of 5 g. The average coefficient of thermal expansion at 30-100° C. in the second measurement was calculated and determined as the coefficient of thermal expansion of the sample substrate.

(3) Evaluation of Copper Foil Adhesion (Copper Foil Peel Strength)

The copper clad laminated plate was immersed in a copper etching liquid to fabricate 3 mm-wide sample copper foil. Subsequently, the adhesion (peel strength) of the copper foil was measured by using a tensile tester.

(4) Evaluation of Hygroscopicity (Water Absorbability)

The copper clad laminated plate was immersed in a copper etching liquid to remove the copper foil to fabricate a sample substrate. With a pressure cooker available from HIRAYAMA MANUFACTURING CORPORATION, the sample substrate was subjected to the pressure cooker process at a temperature of 121° C. under a pressure of 2 atm for 5 hours, and then the water absorbability of the sample substrate was measured.

(5) Evaluation of Hygroscopic Solder Heat Resistance

The copper clad laminated plate was immersed in a copper etching liquid to remove the copper foil to fabricate a 5 cm square sample substrate. With a pressure cooker available from HIRAYAMA MANUFACTURING CORPORATION, the sample substrate was subjected to the pressure cooker process at a temperature of 121° C. under a pressure of 0.2 atm for 4 hours. The sample substrate was immersed in a molten solder bath at a temperature of 288° C. for 20 seconds. Subsequently, the appearance of the sample substrate was observed to evaluate the solder heat resistance.

(6) Evaluation of Copper-Stuck Solder Heat Resistance

A 25 mm square sample substrate was fabricated from the copper clad laminated plate and then floated in a molten solder bath at a temperature of 288° C. for 120 minutes. Subsequently, the appearance of the sample substrate was observed to evaluate the copper-stuck solder heat resistance.

Preparation Example 1: Preparing of Modified Silicone Compound (1-1)

In a 2 litter heating-cooling reactor equipped with a water determination device with a thermometer, a stirrer, and a reflux cooling tube, 75.7 g of KF-8010, 168.0 g of bis(4-maleimide phenyl)methane, 6.4 g of p-aminophenol, and 250.0 g of dimethylacetamide were added. The mixture was reacted at 100° C. for 3 hours to obtain a solution containing the modified silicone compound (1-1).

Preparation Example 2: Preparing of Modified Silicone Compound (1-2)

In a 2 litter heating-cooling reactor equipped with a water determination device with a thermometer, a stirrer, and a reflux cooling tube, 99.2 g of X-22-161A, 164.3 g of 3,3'-diethyl-4,4'-diaminodiphenylmethane, 4.5 g of m-aminophenol, and 250.0 g of dimethylacetamide were added. The mixture was reacted at 100° C. for 3 hours to obtain a solution containing the modified silicone compound (1-2).

Preparation Example 3: Preparing of Modified Silicone Compound (1-3)

In a 2 litter heating-cooling reactor equipped with a water determination device with a thermometer, a stirrer, and a reflux cooling tube, 172.0 g of X-22-1660B-3, 75.1 g of polyphenylmethane maleimide, 2.8 g of p-aminophenol, and 250.0 g of propylene glycol monomethyl ether were added. The mixture was reacted at 115° C. for 3 hours to obtain a solution containing the modified silicone compound (1-3).

Preparation Example 4: Preparing of Modified Silicone Compound (1-4)

In a 2 litter heating-cooling reactor equipped with a water determination device with a thermometer, a stirrer, and a reflux cooling tube, 172.0 g of KF-8012, 75.1 g of bis(4-maleimide phenyl)methane, 2.8 g of p-aminophenol, and 250.0 g of propylene glycol monomethyl ether were added. The mixture was reacted at 115° C. for 3 hours to obtain a solution containing the modified silicone compound (1-4).

Preparation Example 5: Preparing of Modified Silicone Compound (1-5)

In a 2 litter heating-cooling reactor equipped with a water determination device with a thermometer, a stirrer, and a reflux cooling tube, 88.0 g of KF-8012, 14.0 g of 3,3'-diethyl-4,4'-diaminodiphenylmethane, 143.0 g of bis(4-maleimide phenyl)methane, 5.5 g of p-aminophenol, and 250.0 g of propylene glycol monomethyl ether were added. The mixture was reacted at 115° C. for 3 hours to obtain a solution containing the modified silicone compound (1-5).

Preparation Example 6: Preparing of Modified Silicone Compound (1-6)

In a 2 litter heating-cooling reactor equipped with a water determination device with a thermometer, a stirrer, and a reflux cooling tube, 88.0 g of KF-8012, 14.0 g of 3,3'-diaminodiphenylsulfone, 143.0 g of bis(4-maleimide phenyl)methane, 5.5 g of p-aminophenol, and 250.0 g of propylene glycol monomethyl ether were added. The mixture was reacted at 115° C. for 3 hours to obtain a solution containing the modified silicone compound (1-6).

Comparative Preparation Example 1: Preparing of Polyimide (1-7)

In a 2 litter heating-cooling reactor equipped with a thermometer, a stirrer, and a reflux cooling tube, 16.1 g of diaminodiphenylmethane and 236.0 g of bis(4-maleimide phenyl)methane, 18.0 g of p-aminophenol, and 230.0 g of dimethylacetamide were added. The mixture was reacted at 100° C. for 2 hours to obtain a solution containing the polyimide with an acidic substituent (1-7).

Comparative Preparation Example 2: Preparing of Polyimide (1-8)

In a 2 litter heating-cooling reactor equipped with a thermometer, a stirrer, and a reflux cooling tube, 31.7 g of 2,2'-bis[4-(4-aminophenoxy)phenyl]propane and 236.0 g of bis(4-maleimide phenyl)methane, 17.2 g of p-aminophenol, and 230.0 g of propylene glycol monomethyl ether were added. The mixture was reacted at 120° C. for 4 hours to obtain a solution containing the polyimide with an acidic substituent (1-8).

Examples 1-12 and Comparative Examples 1-3

The solutions containing the modified silicone compounds obtained by Preparation examples 1-6 or solutions containing polyimides obtained by Comparative preparation examples 1-2 were each mixed with the thermosetting resin, the inorganic filler, and the curing accelerator as described below in the blending proportion (parts by mass) shown in Tables 1-3 by using methyl ethyl ketone as a dilution solvent to obtain a uniform varnish with a resin content of 65 mass %.

Subsequently, a 0.1 mm-thick E-glass cloth was impregnated and coated with the above-mentioned varnish and then dried by heating at 160° C. for 10 minutes to obtain a prepreg with a resin content of 48 mass %. Four sheets of this prepreg were deposited. On the top and the bottom of the deposited prepreg, a 12 μm-thick electrolytic copper foil was disposed, followed by pressing under a pressure of 2.5 MPa at a temperature of 240° C. for 60 minutes to obtain a copper clad laminated plate. The measurement and evaluation results of the obtained copper clad laminated plate are shown in Tables 1-3.

Thermosetting Resin

PT-30: Novolac cyanate resin [trade name, available from Lonza Japan Ltd.]

BA230: Bisphenol A dicyanate prepolymer [trade name, available from Lonza Japan Ltd.]

EXA-47104: Functional naphthalene epoxy resin [trade name, available from DIC Corporation]

NC-3000-H: Biphenylaralkyl epoxy resin [trade name, available from Nippon Kayaku Co., Ltd.]

EXB-9500: Naphthalene phenol resin [trade name, available from DIC Corporation]

Inorganic Filler

SC2050-KNK: Fused silica [trade name, available from Admatechs Company Limited), BMT-3LV: Boehmite [trade name, available from Kawai Lime Industry Co., Ltd.], Curing Accelerator G-8009L: Isocyanate mask imidazole [trade name, available from Dai-ichi Kogyo Seiyaku Co., Ltd.],

TABLE 1

|  | Example 1 | Example 2 | Example 3 | Example 4 | Example 5 | Example 6 |
|---|---|---|---|---|---|---|
| Thermosetting composition (parts by mass) | | | | | | |
| Modified silicone compound | | | | | | |
| 1-1 | 99.5 | | | | | 50 |
| 1-2 | | | 50 | | | |
| 1-3 | | | | 50 | | |
| 1-5 | | 99.5 | | | 50 | |
| Thermosetting resin | | | | | | |
| PT-30 (Novolac cyanate resin) | | | | | | 49.5 |
| BA230 (Bisphenol A dicyanate prepolymer) | | | 49.5 | | | |
| EXAT-4710 (Naphthalene epoxy resin with four functional groups) | | | | 49.5 | | |
| NC-3000-H (Biphenylaralkyl epoxy resin) | | | | | 49.5 | 49.5 |
| Inorganic filler | | | | | | |
| Fused silica (SC2050-KNK) | | | | | | 50 |
| Boehmite (BMT-3LV) | | | | | | |
| Curing accelerator | | | | | | |
| Isocyanate mask imidazole (G-8009L) | 0.5 | 0.5 | 0.5 | 0.5 | 0.5 | 0.5 |
| Performance of laminate plate | | | | | | |
| (1) Glass transition temperature (° C.) | 240 | 240 | 220 | 220 | 210 | 220 |
| (2) Coefficient of thermal expansion (ppm/° C.) | 7 | 8 | 7 | 6 | 8 | 7 |
| (3) Copper foil adhesion (kN/m) | 0.9 | 0.9 | 0.8 | 0.8 | 0.8 | 0.8 |
| (4) Hygroscopicity (water absorbability %) | 0.4 | 0.4 | 0.3 | 0.3 | 0.3 | 0.3 |
| (5) Hygroscopic solder heat resistance | Not expanded | Not expanded | Not expanded | Not expanded | Not expanded | Not expanded |
| (6) Copper-stuck solder heat resistance | Not expanded | Not expanded | Not expanded | Not expanded | Not expanded | Not expanded |

TABLE 2

|  | Example 7 | Example 8 | Example 9 | Example 10 | Example 11 | Example 12 |
|---|---|---|---|---|---|---|
| Thermosetting composition (parts by mass) | | | | | | |
| Modified silicone compound | | | | | | |
| 1-3 | 50 | | | | | |
| 1-4 | | 50 | 50 | | | |
| 1-5 | | | | 50 | 50 | |
| 1-6 | | | | | | 50 |
| Thermosetting resin | | | | | | |
| PT-30 (Novolac cyanate resin) | | | | | | |
| BA230 (Bisphenol A dicyanate prepolymer) | | 20 | | | | |
| EXAT-4710 (Naphthalene epoxy resin with four functional groups) | 49.5 | 29.5 | 20 | | 49 | |
| NC-3000-H (Biphenylaralkyl epoxy resin) | | | 29.5 | 49.5 | | 49.0 |
| Inorganic filler | | | | | | |
| Fused silica (SC2050-KNK) | 50 | 50 | 50 | 50 | 50 | 60 |
| Boehmite (BMT-3LV) | | | 50 | 50 | 50 | 50 |

TABLE 2-continued

|  | Example 7 | Example 8 | Example 9 | Example 10 | Example 11 | Example 12 |
|---|---|---|---|---|---|---|
| Curing accelerator |  |  |  |  |  |  |
| Isocyanate mask imidazole (G-8009L) | 0.5 | 0.5 | 0.5 | 0.5 | 1.0 | 1.0 |
| Performance of laminate plate |  |  |  |  |  |  |
| (1) Glass transition temperature (° C.) | 230 | 220 | 230 | 210 | 210 | 230 |
| (2) Coefficient of thermal expansion (ppm/° C.) | 7 | 6 | 6 | 7 | 7 | 6 |
| (3) Copper foil adhesion (kN/m) | 0.8 | 0.8 | 0.8 | 0.8 | 0.8 | 0.8 |
| (4) Hygroscopicity (water absorbability %) | 0.3 | 0.3 | 0.3 | 0.3 | 0.3 | 0.3 |
| (5) Hygroscopic solder heat resistance | Not expanded | Not expanded | Not expanded | Not expanded | Not expanded | Not expanded |
| (6) Copper- stuck solder heat resistance | Not expanded | Not expanded | Not expanded | Not expanded | Not expanded | Not expanded |

TABLE 3

|  | Comparative example 1 | Comparative example 2 | Comparative example 3 |
|---|---|---|---|
| Thermosetting composition (parts by mass) |  |  |  |
| Polyimide |  |  |  |
| 1-7 | 50 |  |  |
| 1-8 |  | 50 |  |
| Thermosetting resin |  |  |  |
| PT-30 (Novolac cyanate resin) | 49.5 |  |  |
| EXAT-4710 (Naphthalene epoxy resin with four functional groups) |  | 49.5 | 70 |
| Phenol resin |  |  |  |
| EBX- 9500 (Naphthalene phenol resin) |  |  | 29.5 |
| Inorganic filler |  |  |  |
| Fused silica (SC2050- KNK) | 100 | 100 | 100 |
| Curing accelerator |  |  |  |
| Isocyanate mask imidazole (G-8009L) | 0.5 | 0.5 | 0.5 |
| Performance of laminate plate |  |  |  |
| (1) Glass transition temperature (° C.) | 230 | 220 | 230 |
| (2) Coefficient of thermal expansion (ppm/° C.) | 11 | 10 | 11 |
| (3) Copper foil adhesion (kN/m) | 1.0 | 1.0 | 1.0 |
| (4) Hygroscopicity (water absorbability %) | 0.6 | 0.6 | 0.5 |
| (5) Hygroscopic solder heat resistance | Not expanded | Not expanded | Not expanded |
| (6) Copper- stuck solder heat resistance | Not expanded | Not expanded | Expanded |

As are clear from Tables 1-3, the examples of the present invention have an excellent glass transition temperature, coefficient of thermal expansion, copper foil adhesion, hygroscopicity, hygroscopic solder heat resistance, and copper-stuck solder heat resistance. On the other hand, in the comparative examples, any of the glass transition temperature, coefficient of thermal expansion, copper foil adhesion, hygroscopicity, hygroscopic solder heat resistance, and copper-stuck solder heat resistance are inferior when compared with those of the examples.

INDUSTRIAL APPLICABILITY

The multi-layered printed wiring board produced by using the laminated plate formed by using the prepreg obtained from the modified silicone compound and the thermosetting resin composition of the present invention through laminate molding has an excellent glass transition temperature, coefficient of thermal expansion, copper foil adhesion, hygroscopicity, hygroscopic solder heat resistance, and copper-stuck solder heat resistance. Therefore, the multi-layered printed wiring board is useful as a highly integrated semiconductor package and a printed wiring board for an electronic device.

The invention claimed is:
1. A modified silicone compound prepared by reacting:
(A) a siloxane diamine component comprising a siloxane diamine represented by a general formula (1):

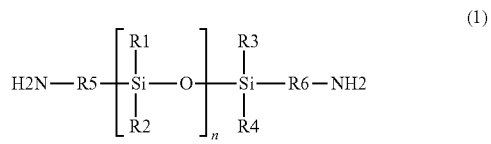

(1)

wherein a plurality of $R_1$s each independently represent an alkyl group, a phenyl group, or a substituted phenyl group and may be the same as or different from each other, a plurality of $R_2$s each independently represent an alkyl group, a phenyl group, or a substituted phenyl group and may be the same as or different from each other, $R_3$ and $R_4$ each independently represent an alkyl group, a phenyl group, or a substituted phenyl group, $R_5$ and $R_6$ represent $C_3H_6$, n represents an integer of 2-50, and at least one of the following conditions (i)-(iv) is met:
(i) at least one of the $R_1$s represents a phenyl group or a substituted phenyl group,
(ii) at least one of the $R_2$s represents a phenyl group or a substituted phenyl group,
(iii) $R_3$ represents a phenyl group or a substituted phenyl group, and
(iv) $R_4$ represents a phenyl group or a substituted phenyl group;
(B) a maleimide component comprising a maleimide compound with at least two N-substituted maleimide groups in a molecular structure, wherein an amount of the maleimide component (B) is 100-3000 parts by mass, based on 100 parts by mass of the siloxane diamine component (A);
(C) an amine component comprising an amine compound with an acidic substituent represented by a general formula (2):

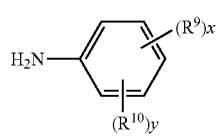

(2)

wherein $R^9$ or a plurality of $R^9$s each independently represent a hydroxyl, a carboxyl, or a sulfonic group that is an acidic substituent, $R^{10}$ or a plurality of $R^{10}$s each independently represent a hydrogen atom, an aliphatic hydrocarbon group with 1-5 carbon atoms, or a halogen atom, x represents an integer of 1-5, y represents an integer of 0-4, and x+y=5, and
an amount of the amine compound represented by general formula (2) is 1-8.454 parts by mass, based on 100 parts by mass of the siloxane diamine represented by general formula (1); and
(D) an optional amine component comprising at least one selected from the group consisting of m-phenylenediamine, p-phenylenediamine, 1,4-bis(4-aminophenoxy) benzene, 4,4'-diaminodiphenylmethane, 3,3'-dimethyl-4,4'-diaminodiphenylmethane, 3,3'-diethyl-4,4'-diaminodiphenylmethane, 4,4'-diaminobenzophenone, 4,4'-diaminodiphenyl ether, 3,3'-diaminodiphenyl sulfone, 4,4'-diaminodiphenyl sulfone, benzidine, 4,4'-diaminodiphenyl sulfide, 4,4'-diamino-3,3'-biphenyldiol, and a guanamine.

2. A thermosetting resin composition comprising the modified silicone compound according to claim 1.

3. The thermosetting resin composition according to claim 2, further comprising an epoxy resin and/or a cyanate resin.

4. The thermosetting resin composition according to claim 2, further comprising an inorganic filler.

5. A prepreg formed from the thermosetting resin composition according to claim 2.

6. A laminated plate formed from the prepreg according to claim 5 through laminate molding.

7. A multi-layered printed wiring board produced from the laminated plate according to claim 6.

8. The modified silicone compound according to claim 1, wherein a ratio of C=C groups of the maleimide groups of the maleimide component (B) to total —NH$_2$ groups of the siloxane diamine component (A), the amine component (C) and the optional amine component (D) is 0.1≤C=C groups/ total —NH$_2$ groups≤10.0.

9. The modified silicone compound according to claim 1, wherein an amine equivalent of the siloxane diamine component (A) is 430-2,200.

10. The thermosetting resin composition according to claim 3, wherein the epoxy resin includes at least one selected from the group consisting of a biphenyl aralkyl epoxy resin and a naphthalene epoxy resin, and the cyanate resin includes at least one selected from the group consisting of a novolac cyanate resin and bisphenol cyanate resin.

11. The thermosetting resin composition according to claim 10, further comprising an imidazole curing accelerator.

12. The thermosetting resin composition according to claim 11, further comprising at least one inorganic filler selected from the group consisting of silica and boehmite.

13. The modified silicone compound according to claim 1, wherein
the maleimide component (B) comprises one or more of bis(4-maleimide phenyl)methane and polyphenylmethane maleimide,
the amine component (C) comprises aminophenol, and
the optional amine component (D) comprises one or more of 3,3'-diethyl-4,4'-diaminodiphenylmethane and 3,3'-diaminodiphenylsulfone.

14. A prepreg comprising a semi-cured form of the thermosetting resin composition according to claim 2.

15. A laminated plate comprising a cured form of the prepreg according to claim 14.

16. A multi-layered printed wiring board comprising the laminated plate according to claim 15.

17. A modified silicone compound prepared by reacting reactants comprising:
(A) a siloxane diamine component comprising a siloxane diamine represented by a general formula (1):

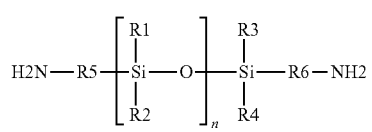

(1)

wherein a plurality of $R_1$s each independently represent an alkyl group, a phenyl group, or a substituted phenyl group and may be the same as or different from each other, a plurality of $R_2$s each independently represent an alkyl group, a phenyl group, or a substituted phenyl group and may be the same as or different from each other, $R_3$ and $R_4$ each independently represent an alkyl group, a phenyl group, or a substituted phenyl group, $R_5$ and $R_6$ represent $C_3H_6$, n represents an integer of 2-50, and at least one of the following conditions (i)-(iv) is met:
(i) at least one of the $R_1$s represents a phenyl group or a substituted phenyl group,
(ii) at least one of the $R_2$s represents a phenyl group or a substituted phenyl group,
(iii) $R_3$ represents a phenyl group or a substituted phenyl group, and
(iv) $R_4$ represents a phenyl group or a substituted phenyl group;
(B) a maleimide component comprising a maleimide compound with at least two N-substituted maleimide groups in a molecular structure, wherein an amount of the maleimide component (B) is 100-3000 parts by mass, based on 100 parts by mass of the siloxane diamine component (A);

(C) an amine component comprising an amine compound with an acidic substituent represented by a general formula (2):

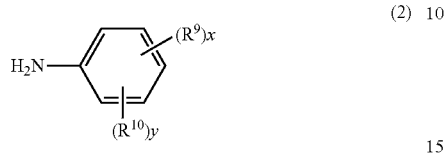

wherein $R^9$ or a plurality of $R^9$s each independently represent a hydroxyl, a carboxyl, or a sulfonic group that is an acidic substituent, $R^{10}$ or a plurality of $R^{10}$s each independently represent a hydrogen atom, an aliphatic hydrocarbon group with 1-5 carbon atoms, or a halogen atom, x represents an integer of 1-5, y represents an integer of 0-4, and x+y=5, and an amount of the amine compound represented by general formula (2) is 1-8.454 parts by mass, based on 100 parts by mass of the siloxane diamine represented by general formula (1); and (D) an optional amine component comprising an amine compound including at least two primary amino groups per molecule.

* * * * *